(12) United States Patent
Motoki et al.

(10) Patent No.: US 6,773,504 B2
(45) Date of Patent: Aug. 10, 2004

(54) OXYGEN DOPING METHOD TO GALLIUM NITRIDE SINGLE CRYSTAL SUBSTRATE AND OXYGEN-DOPED N-TYPE GALLIUM NITRIDE FREESTANDING SINGLE CRYSTAL SUBSTRATE

(75) Inventors: Kensaku Motoki, Itami (JP); Masaki Ueno, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 24 days.

(21) Appl. No.: 10/098,501

(22) Filed: Mar. 18, 2002

(65) Prior Publication Data

US 2002/0189532 A1 Dec. 19, 2002

(30) Foreign Application Priority Data

Apr. 12, 2001 (JP) .......................... 2001-113872

(51) Int. Cl.[7] .......................... C30B 25/02; C30B 31/06
(52) U.S. Cl. ................................. 117/88; 117/2
(58) Field of Search .................. 117/84, 88, 2

(56) References Cited

U.S. PATENT DOCUMENTS

| | | | | |
|---|---|---|---|---|
| 5,821,568 A | * | 10/1998 | Morita et al. | 257/94 |
| 5,909,036 A | * | 6/1999 | Tanaka et al. | 257/94 |
| 6,072,197 A | * | 6/2000 | Horino et al. | 257/103 |
| 6,086,673 A | * | 7/2000 | Molnar | 7/200 |
| 6,107,162 A | * | 8/2000 | Morita et al. | 438/462 |
| 6,225,650 B1 | * | 5/2001 | Tadatomo et al. | 257/190 |
| 6,335,546 B1 | * | 1/2002 | Tsuda et al. | 257/94 |
| 6,411,636 B1 | * | 6/2002 | Ota et al. | 372/43 |
| 6,542,526 B1 | * | 4/2003 | Niwa et al. | 372/45 |
| 6,576,533 B2 | * | 6/2003 | Tomiya et al. | 438/481 |

FOREIGN PATENT DOCUMENTS

| | | |
|---|---|---|
| JP | 11-340576 | 12/1999 |
| JP | 2000-12900 | 1/2000 |
| JP | 2000-22212 | 1/2000 |
| JP | 2000-44400 | 2/2000 |
| JP | 2001-102307 | 4/2001 |
| JP | 2002-29897 | 1/2002 |

OTHER PUBLICATIONS

Invitation Thesis, Collection of Theses of Electronic Information Communication Society C–II vol. J81–C–II No. 1 pp. 58–64, Jan., 1998 "Thick Layer Growth of GaN by Hydride Vapor Phase Epitaxy", Akira Usui.

Preparation of Large Freestanding GaN Substrates by Hydride Vapor Phase Epitaxy Using GaA as a Starting Substrate, Jpn. J. Appl. Phys. vol. 40 (2001) pp. L140–L143, Part 2, No. 2B, Feb. 15, 2001.

* cited by examiner

Primary Examiner—Nadine G. Norton
Assistant Examiner—Matthew Anderson
(74) Attorney, Agent, or Firm—Smith, Gambrell & Russell, LLP

(57) ABSTRACT

Oxygen can be doped into a gallium nitride crystal by preparing a non-C-plane gallium nitride seed crystal, supplying material gases including gallium, nitrogen and oxygen to the non-C-plane gallium nitride seed crystal, growing a non-C-plane gallium nitride crystal on the non-C-plane gallium nitride seed crystal and allowing oxygen to infiltrate via a non-C-plane surface to the growing gallium nitride crystal. Otherwise, oxygen can be doped into a gallium nitride crystal by preparing a C-plane gallium nitride seed crystal or a three-rotationally symmetric plane foreign material seed crystal, supplying material gases including gallium, nitrogen, and oxygen to the C-Plane gallium nitride seed crystal or the three-rotationally symmetric foreign seed crystal, growing a faceted C-plane gallium nitride crystal having facets of non-C planes on the seed crystal, maintaining the facets on the C-Plane gallium nitride crystal and allowing oxygen to infiltrate via the non-C-Plane facets to the gallium nitride crystal.

14 Claims, 4 Drawing Sheets

Fig.2(a)   Embodiment 1

$(1\bar{1}00)$

Fig.2(b)

$(1\bar{1}00)$ $(1\bar{1}00)$

Fig.2(c)

$(1\bar{1}00)$

Fig.2(d)

$(1\bar{1}00)$

Fig.3(a) Comparison Example 1

Fig.4(a) Embodiment 2
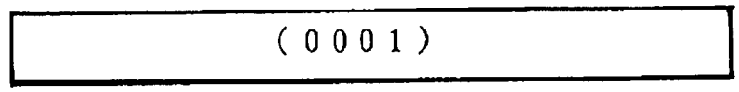
(0 0 0 1)
Fig.4(b)
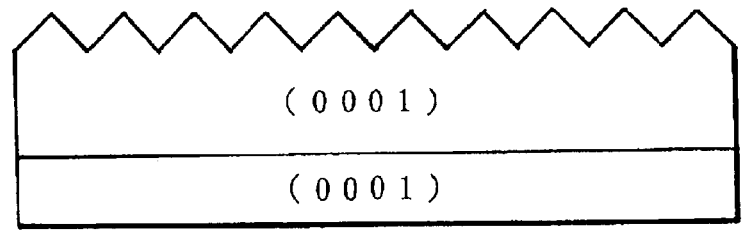
(0 0 0 1)
(0 0 0 1)
Fig.4(c)
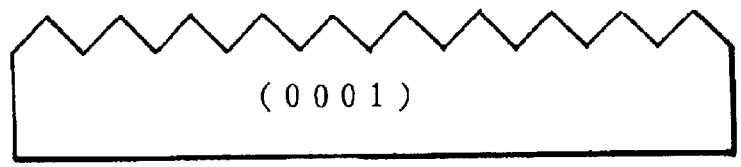
(0 0 0 1)
Fig.4(d)
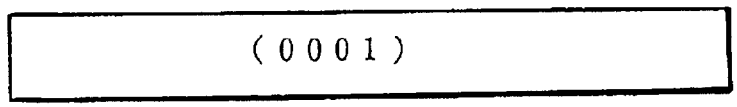
(0 0 0 1)

OXYGEN DOPING METHOD TO GALLIUM NITRIDE SINGLE CRYSTAL SUBSTRATE AND OXYGEN-DOPED N-TYPE GALLIUM NITRIDE FREESTANDING SINGLE CRYSTAL SUBSTRATE

BACKGROUND OF THE INVENTION

1. Field of the Invention

This invention relates to an oxygen doping method into a gallium nitride crystal and an oxygen-doped n-type gallium nitride single crystal substrate for producing light emitting diodes (LEDs), laser diodes (LDs) or other electronic devices of groups 3 and 5 nitride semiconductors. Nitride semiconductors means GaN, InGaN, InAlGaN and so on which are grown as thin films on a sapphire substrate. An activation layer is a GaInN layer. Other parts are mainly GaN layers. Thus, the light emitting diodes based upon the nitride semiconductors are represented as GaN-LEDs or InGaN-LEDs which mean the same LEDs.

This application claims the priority of Japanese Patent Application No. 2001-113872 filed on Apr. 12, 2001 which is incorporated herein by reference.

2. Description of Related Art

Light emitting devices making use of nitride semiconductors have been put on the market as blue-light LEDs. At present, all of the available nitride light emitting devices are made upon sapphire substrates. An epitaxial wafer is obtained by growing a GaN film, a GaInN film and so forth upon a C-plane single crystal sapphire substrate heteroepitaxially. A unique n-dopant for GaN, AlInGaN, or InGaN thin films is silicon (Si). Silicon acts as an n-impurity in GaN by replacing a gallium site. A series of wafer processes produces GaInN-LEDs on the on-sapphire epitaxial wafer. A lattice constant of sapphire ($\alpha$-$Al_2O_3$) is different from that of gallium nitride. Despite the large lattice misfit, a sapphire substrate allows gallium nitride to grow heteroepitaxially on it. The on-sapphire GaN includes great many dislocations. In spite of the many dislocations, the GaN films on sapphire are stable and endurable.

Sapphire is a crystal of a trigonal symmetry group. C-plane of sapphire has quasi-three fold rotation symmetry. Gallium nitride belongs to hexagonal symmetry. C-plane of gallium nitride has perfect three-fold rotation symmetry. Since the symmetry groups are different for GaN and sapphire, any other planes than C-plane of sapphire cannot grow a GaN crystal. Thus, the GaInN-LEDs in use include sets of c-axis grown InGaN, InGaAlN or GaN thin films grown on C-planes of sapphire substrates.

All the GaN or GaInN thin films heteroepitaxially grown on the sapphire substrates are C-plane growing crystals. Sapphire substrates cannot make non-C-plane growing GaN crystals at all. Since sapphire has been a unique seed crystal for growing GaN until recently, it has been impossible to make a non-C-plane GaN crystal. At present, all the GaInN-LEDs and GaInN-LDs on the market consist of a pile of C-plane grown GaN, InGaN or AlInGaN thin films grown on C-plane sapphire substrates.

Large lattice misfit between sapphire and gallium nitride induces plenty of dislocations in a gallium nitride crystal grown on a sapphire substrate. Gallium nitride has rigidity as high as ceramics. The rigidity maintains the framework of crystals for a long time. Inherent dislocations in GaN crystals of LEDs do not enlarge by current injection unlike GaAs crystals. Since the dislocations do not increase, the GaN crystals on sapphire do not degrade. In spite of the great many dislocations, GaN-LEDs enjoy a long life time, high reliability and good reputation.

Sapphire substrates, however, have some drawbacks. Sapphire is a very rigid, hard crystal. Sapphire lacks cleavage. Sapphire is an insulator. Rigidity, non-cleavage and insulation are weak points of sapphire. When a plenty of device units have been fabricated upon a sapphire substrate wafer by wafer processes, the device-carrying sapphire wafer cannot be divided by natural cleavage like silicon wafers. The sapphire wafer should be mechanically cut and divided into individual device chips. The mechanical dicing step raises the cost.

The non-cleavage is not a serious obstacle for making LEDs (light emitting diodes) on sapphire substrates, since an LED has no resonator mirror. In the case of producing LDs (laser diodes) on sapphire substrates, the non-cleavage is a fatal drawback. A laser diode (LD) requires two mirrors at both ends of an active (stripe) layer as a resonator for amplifying light by injected current. It is convenient to form resonator mirrors by natural cleavage in a laser diode, because natural cleaved planes are endowed with flatness and smoothness. On-sapphire LDs prohibit natural cleavage from making resonator mirrors. Flat, smooth mirrors should be made on both ends of the laser chips by a vapor phase etching method, e.g., RIE (reactive ion etching), which is a difficult operation. Mirror-polishing should be done chip by chip after the wafer process has finished. Mirror-finishing of the resonators by the RIE is a main reason raising the cost of manufacturing the on-sapphire GaInN-LDs.

Another drawback results from the fact that sapphire is an insulator. Insulation prevents on-sapphire LEDs and LDs from having an n-electrode on the bottom. Sapphire forces LEDs and LDs to have extra n-type layers upon an insulating substrate but below an active layer. The n-electrode is formed by partially etching away a p-layer and the active layer, revealing the extra n-layer and depositing an n-electrode alloy on the n-layer. Both a p-electrode and the n-electrode are formed on the top surface of the LED or LD. Since electric current flows in the horizontal direction, the n-layer should have a sufficient thickness. It takes much time to eliminate a part of the p-layer and form an ohmic n-electrode on the revealed n-layer. An increase of the steps and time enhances the cost of the on-sapphire LEDs. Both the n-electrode and the p-electrode occupy a wide area on the top of the LED, which raises a necessary area of the LED. On-sapphire GaInN-LEDs which are prevailing cannot conquer the above drawbacks yet.

A gallium nitride (GaN) single crystal substrate would be an ideal substrate which has a probability of solving the drawbacks. Since thin films of GaN or GaInN are epitaxially deposited upon a substrate for producing blue light LEDs and LDs, a GaN bulk single crystal would eliminate the problem of lattice misfitting between the deposited films and the substrate. If an n-type bulk single crystal GaN substrate can be produced, an n-electrode can be formed on the bottom of the n-type GaN substrate. An allocation of a p-electrode at the top and an n-electrode at the bottom facilitates to produce LEDs, to bond the LEDs on packages, and to wirebond the LEDs to wiring patterns on the packages. The bottom n-electrode enables an LED to reduce the chip size.

Another advantage results from cleavability of a bulk GaN single crystal. A device-produced GaN wafer can be divided into stripe arrays of individual device (LED or LD) chips by natural cleavage. However, cleavage planes (1-100), (01-10) and (-1010) are parallel to three sides of an equilateral triangle defined upon a C-plane (0001) of GaN. The GaN crystal has not a square set of cleavage planes but a triangle set of cleavage planes. Square device (LED or LD) chips are produced by cutting a device-carrying GaN wafer partially by natural cleavage and partially by mechanical dicing.

Furthermore, an LD (laser diode) chip can produce resonator mirrors by natural cleavage. Replacement of the RIE by the natural cleavage reduces the cost of making GaInN-type blue light laser diodes (LDs).

However, there is no mineral containing gallium nitride single crystals. No attempt of making a wide, bulk GaN single crystal substrate artificially has succeeded until recently. Since a GaN single crystal substrate was inaccessible, it was not possible to make GaInN type LEDs or LDs on a single crystal GaN substrate until recently.

Recently, vapor epitaxial methods which can grow a GaN single crystal on a foreign material substrate have been proposed and improved. The methods are described as follows.

(1) Metallorganic Chemical Vapor Deposition Method (MOCVD)

The most prevailing method for making GaN crystals is a Metallorganic Chemical Vapor Deposition Method (MOCVD). The MOCVD produces a GaN crystal by placing a sapphire substrate in a cold-wall furnace, heating the sapphire substrate, supplying a material gas including TMG (trimethylgallium) and ammonia ($NH_3$) to the sapphire substrate, and synthesizing gallium nitride (GaN) from the material gas on the substrate. Although a great amount of the material gas is inhaled into the furnace, only a part of the material gas reacts with each other for making gallium nitride molecules. Other part of the material gas is dissipated in vain. The MOCVD is suffering from low yield and low growing speed. The MOCVD is favorable for making thin GaN films but is unsuitable for producing a thick GaN crystal layer due to the material dissipation. Another drawback is possibility of carbon contamination due to carbon included in the metallorganic gases.

(2) Metallorganic Chloride Method (MOC)

An MOC method produces a GaN crystal by placing a sapphire substrate or GaAs substrate in a hot-wall furnace, supplying TMG (trimethylgallium) and HCl (hydrochloric acid) into the furnace, synthesizing GaCl (gallium chloride) above the substrate, supplying ammonia ($NH_3$) to the heated substrate, inducing a reaction between $NH_3$ and GaCl on the substrate, making gallium nitride molecules on the substrate and depositing the gallium nitride molecules on the substrate. Since the MOC method makes once an intermediate compound GaCl, carbon contamination is alleviated in comparison with the MOCVD. However, the MOC is not fully immune from possibility of carbon contamination, since the MOC employs trimethylgallium gas.

(3) Hydride Vapor Phase Epitaxy Method (HVPE)

Unlike the MOCVD or the MOC, an HVPE employs metal Ga monoelement as a gallium source. FIG. 1 shows a HVPE apparatus having a hot-wall furnace 1. A heater 2 is upholstered around the furnace 1. Gas inlets 3 and 4 are provided at the top of the furnace 1 for introducing two kinds of material gases. The furnace 1 sustains a Ga-boat 5 at an upper space. A Ga-melt 6 is prepared by putting metal Ga into the Ga-boat 5 and heating the Ga-boat 5 by the heater 2. One gas inlet 3 has an open end facing to the Ga-boat 5 for supplying $H_2$+HCl gas to the Ga-boat 5. The other gas inlet 4 has an open end at a middle height of the furnace for introducing $H_2$+$NH_3$ gas.

A susceptor 7 is supported by a rotation shaft 8 in a lower half of the furnace 1. The rotation shaft 8 can rotate, lift up or down the susceptor 7. A GaAs substrate or a GaN substrate 9 is laid upon the susceptor 7 as a seed. A GaN seed crystal can be prepared by making a GaN crystal on a GaAs substrate, eliminating the GaAs substrate and slicing the grown GaN crystal into wafers. The heater 2 heats the susceptor 7 and the substrate 9. An intermediate compound gallium chloride GaCl gas is synthesized by blowing the HCl+$H_2$ gas to the Ga-melt 6 in the boat 5. GaCl falls in the furnace near the substrate 9, reacts with ammonia and synthesizes gallium nitride (GaN) on the substrate 9. The HVPE uses a non-carbon material (Ga monoelement). The HVPE is free from possibility of carbon contamination which degrades electric properties of object crystals.

(4) Sublimation Method

Heating alone cannot convert solid GaN into a melt of Ga. High pressure is required for melting solid GaN besides heating. Difficulty of making a GaN melt prohibits a Czochralski method or a Bridgman method from growing a GaN solid from a GaN melt. Without high pressure, solid GaN sublimes into vapor GaN by heating. A sublimation method makes a GaN single crystal on a substrate by inserting a substrate and a GaN polycrystal source into a reaction tube, heating the GaN polycrystal source for subliming at a higher temperature, heating the substrate at a lower temperature, transporting GaN vapor from the GaN source to the colder substrate and depositing GaN molecules on the substrate.

Another improvement (Lateral Overgrowth Method) has been proposed for making a low-dislocation density GaN film grown on a sapphire substrate for making on-sapphire GaInN-LEDs.

[Epitaxial Lateral Overgrowth Method (ELO)]

①Akira Usui, "Thick Layer Growth of GaN by Hydride Vapor Phase Epitaxy", Electronic Information and Communication Society, C-II, vol.J81-C-II, No. 1, pp58–64, (January, 1998), proposed a growth of GaN by a lateral overgrowth method. The lateral overgrowth method produces a low dislocation density GaN crystal by covering a sapphire substrate with a mask having dotted or striped windows lying at corner points of periodically allocated equilateral triangles, supplying material gas via the mask windows to the sapphire substrate, depositing GaN molecules on the sapphire substrate within the windows, growing further GaN films from the windows over on the mask, joining neighboring GaN films in horizontal directions along boundaries between the windows on the mask, turning the growing direction from the horizontal directions to the vertical direction and maintaining the vertical GaN growth on the mask. Dislocations have a tendency of extending along the growing direction. Many dislocations accompany GaN growth in any cases. The ELO method forces the dislocations to bend at the meeting boundaries above the mask from horizontal extensions to an upward extension. The change of extension reduces the dislocations in the GaN crystal. Thus, the ELO is effective to reduce dislocation density of a GaN thin film grown on a sapphire substrate.

Inventors of the present invention chose the HVPE method as a very promising candidate among the mentioned vapor phase growth methods for growing a thick GaN crystal for a freestanding GaN wafer. Almost all of the preceding trials for growing GaN films have started from sapphire single crystals as a substrate. Sapphire has, however, some drawbacks of non-existence of cleavage and impossibility of removal. The inventors abandoned sapphire as a substrate for making a freestanding GaN single crystal.

Instead of sapphire, the inventors of the present invention chose GaAs (gallium arsenide) as a substrate for growing a thick GaN crystal for making a freestanding GaN single crystal wafer. Although GaAs has a cubic symmetry which is different from the hexagonal symmetry of GaN and the trigonal symmetry of sapphire, a (111) GaAs plane has three-fold rotation symmetry akin to the hexagonal symmetry. The inventors of the present invention succeeded in growing a GaN crystal on a (111) GaAs substrate in the c-direction from materials of metal gallium, hydrogen-diluted hydrochloric acid (HCl) gas and hydrogen-diluted ammonia gas. Fortunately, the GaAs substrate can be eliminated from the grown GaN crystal by etching or polishing. Possibility of removal is an advantage of GaAs as a substrate for making a freestanding GaN crystal.

② Japanese Patent Application No. 10-183446(183446/'98) was filed by the same inventor as the present invention. ② produced a GaN single crystal by preparing a GaAs (111) substrate, covering the GaAs substrate with a mask having windows, growing a thick GaN layer on the masked GaAs substrate by the HVPE and the ELO method, and eliminating the GaAs substrate by aqua regia. ② obtained a freestanding GaN bulk single crystal wafer having a 20 mm diameter and a 0.07 mm thickness. The GaN crystal was a C-(0001) plane crystal.

③ Japanese Patent Application No. 10-171276(171276/'98) was filed by the same inventor as the present invention. ③ also proposed a freestanding GaN bulk single crystal wafer of a C-plane produced by depositing a thick GaN crystal upon a (111) GaAs substrate. Distortion of the GaN wafer was a problem. Distortion is induced on the freestanding GaN wafer by differences of thermal expansion between GaAs and GaN. How to reduce the distortion was another problem for ③. Conduction type of the GaN crystal was left untouched.

④ Kensaku Motoki, Takuji Okahisa, Naoki Matsumoto, Masato Matsushima, Hiroya Kimura, Hitoshi Kasai, Kikurou Takemoto, Koji Uematsu, Tetsuya Hirano, Masahiro Nakayama, Seiji Nakahata, Masaki Ueno, Daijirou Hara, Yoshinao Kumagai, Akinori Koukitu and Hisashi Seki, "Preparation of Large Freestanding GaN Substrates by Hydride Vapor Phase Epitaxy Using GaAs as a Starting Substrate", Jpn. J. Appl. Phys. Vol.40(2001) pp.L140–143, reported a freestanding GaN single crystal produced by a lateral overgrowth method upon a GaAs (111) substrate. Grown GaN was a (0001) C-plane crystal having a 500 μm thickness and a 2 inch diameter. The GaN crystal showed n-type conduction. Dislocation density was $2\times10^5$ cm$^{-2}$. Carrier density was n=$5\times10^{18}$ cm$^{-3}$. Mobility was 170 cm$^2$/Vs. Resistivity was $8.5\times10^{-3}$ Ωcm. ④ said nothing about n-dopants.

⑤ Japanese Patent Application No. 11-144151 was filed by the same inventor as the present invention. ⑤ proposed a freestanding n-type GaN single crystal containing oxygen as an n-dopant having nearly 100% of activation rate in GaN. This was the first document which asserted that oxygen was a good n-dopant in GaN with nearly a 100% activation rate. Silicon (Si) has been prevailing as an n-dopant which has been exclusively doped into GaN thin films grown on sapphire substrates in a form of silane gas (SiH$_4$). But silane gas (SiH$_4$) is a dangerous gas. Oxygen can be supplied in a safe form of water or water vapor to material gases. ⑤ rejected silicon but admitted oxygen as an n-dopant in GaN. ⑤ insisted on replacement of silicon by oxygen. ⑤ alleged that carbon (C) which is an n-impurity and disturbs the action of oxygen should be excluded from the material gases. ⑤ denied the MOCVD (metallorganic chemical vapor deposition) method which uses metallorganic gases including plenty of carbon atoms but recommended the HVPE (hydride vapor phase epitaxy) method.

GaN is a hexagonal symmetry crystal with three-fold rotational symmetry. Crystallographical representation of GaN is different from GaAs(zinc blende type) which belongs to the cubic symmetry group. Crystallographic representation of the hexagonal symmetry group is now described. There are two representations for hexagonal symmetry. One method uses three parameters. The other method uses four parameters. Here, four parameter representation which requires four axes is described. Three axes are denoted by a-axis, b-axis and d-axis which lie on the same horizontal plane and meet at an origin with each other at 120 degrees. Unit lengths a, b and d of the three axes are equal, that is, a=b=d.

An extra axis meets with other three axes at 90 degrees. The extra axis is named c-axis. A set of a-, b-, d-, and c-axes defines planes and directions in a hexagonal symmetry crystal. The three a-, b-, d-axes are equivalent. But the c-axis is a unique axis. A set of plenty of parallel equivalent planes is imagined. When a first plane crosses a-axis at a point of a/h, b-axis at a point of b/k, d-axis at a point of d/m and c-axis at a point of c/n, the plane is represented by (hkmn). When the first plane cannot cross a positive part of the axes, the axes should be extended in a negative direction for crossing with the first plane. Crystal has a periodic character. Thus, h, k, m and n are positive or negative integers including zero (0). Number "h" means the number of the object planes existing in a unit length "a" of a-axis. Number "k" means the number of the object planes existing in a unit length "b" of b-axis. The object plane is represented a round bracketed indices (hkmn).

Three equivalent indices h, k and m for a-, b-, d-axes always satisfy a zero-sum rule of h+k+m=0. The other index n for c-axis is a free parameter. Crystal indices h, k, m and n are substituted in a bracket without comma ",". A negative index should be discriminated from a positive one by upperlining by the crystallograpy. Since an upperline is forbidden, a negative index is shown by adding a minus sign before the integer. There are two index representations. One is an individual representation. The other is a collective representation. Objects of the index representation are planes and directions. A direction and a plane take the same set hkmn of indices, when the direction is a normal (meeting at 90 degrees) to the plane. But the kinds of brackets are different.

Round bracketed (hkmn) means an individual representation of a plane. Wavy bracketed {hkmn} means a collective representation of family planes. Family planes are defined as a set of planes all of which can be converted into other member planes by the symmetry operation included in the crystal symmetry.

Besides the plane representation, linear directions should be denoted by a similar manner. Square bracketed [hkmn] means an individual representation of a direction which is vertical to an individual plane (hkmn). Edged bracketed <hkmn> means a collective representation of family directions. Family directions are defined as a set of directions all of which can be converted into other member directions by the symmetry operation of the crystal symmetry. The definitions are shown as follows.

| | |
|---|---|
| (hkmn) | individual, plane. |
| {hkmn} | collective, plane. |
| [hkmn] | individual, direction. |
| <hkmn> | collective, direction. |

In the hexagonal symmetry, C-plane is the most important plane represented as (0001) which is normal to the horizontal plane including a-, b- and c-axes. C-plane has three-fold rotational symmetry. All of the artificially made GaN crystals have been produced by C-plane growth which grows a crystal by maintaining C-plane as a surface. When GaN is heteroepitaxially grown on a foreign material, for example, sapphire ($Al_2O_3$) or gallium arsenide (GaAs), the seed surface should have three-fold rotational symmetry. Thus, GaN grows on the foreign substrate with the three-fold rotation symmetry, maintaining C-plane which has also the same symmetry. Thus, heteroepitaxy on a foreign substrate is restricted to C-plane growth. There are two secondary important planes next to C-plane.

One important plane is {1-100} planes which are vertical to C-plane. This is a cleavage plane. The {1-100} planes mean a set of six individual planes (1-100), (10-10), (01-10), (-1100), (-1010) and (0-110) which are all cleavage planes. The (1-100), (10-10), (01-10), (-1100), (-1010) and (0-110) planes are called "M-plane" for short. The cleavage planes meet with each other at 60 degrees. Any two cleavage planes are not vertical.

The other important plane is {11-20} planes which are vertical to C-plane. The {11-20} planes mean a set of six individual planes (11-20), (1-210), (-2110), (2-1-10), (-12-10) and (-1-120). The (11-20), (1-210), (-2110), (2-1-10), (-12-10) and (-1-120) planes are called "A-plane" for short. A-planes are not cleavage planes. A-planes meet with each other at 60 degrees.

C-plane {0001} is uniquely determined. But A-planes and M-planes are not uniquely determined, since A-planes and M-planes include three different planes. Some of A-planes are vertical to some of M-planes.

All A-planes are vertical to C-plane. All M-planes are vertical to C-plane. Some of A-planes, some of M-planes and C-plane can build a set of orthogonal planes.

⑥ Japanese Patent Application No. 10-147049(147049/'98) was filed by the same inventor as the present invention. ⑥ proposed non-rectangular GaN devices which have sides of cleavage planes (M-planes). The GaN crystal has C-plane as a surface.

⑦ Japanese Patent Application No. 11-273882(273882/'99) was filed by the same inventor as the present invention. Conventional growth means a growth by maintaining a mirror-flat, even C-plane surface. ⑦ proposed facet-growth of GaN along c-axis which keeps various facets on C-plane. The facets on C-plane signify small other planes than C-plane. Facets form hexagonal pits or hillocks and dodecagonal pits or hillocks on C-plane. Although GaN grows on an average along the c-axis, various facets cover a surface of growing GaN. The facets sweep dislocations down to the bottoms of the facet pits. Dislocations are effectively reduced by the facets.

⑧ Japanese Patent Application No. 2000-207783 (207783/'00) was filed by the same inventor as the present invention. ⑧ discovered a fact that dislocations extend in parallel with the growing direction in a GaN crystal. C-plane growth prolongs dislocations in parallel with the c-axis. ⑧ proposed a sophisticated method of growing a tall GaN crystal in the c-direction on a C-plane of a GaN seed, cutting the GaN crystal in A planes, obtaining an A-plane GaN seed crystal, growing the GaN crystal in an A-direction on the A-plane seed, cutting the A-grown GaN in M planes and obtaining M-plane GaN seeds with low dislocation density. Prior art of ① to ⑦ grow C-plane GaN crystals in the c-direction on a foreign material or a C-plane GaN seed. Only ⑧ proposed non-C-plane growth of GaN on a non-C-plane GaN substrate.

All of the known attempts of on-sapphire GaN growth grow C-surface GaN crystals having a C-surface as a top without exception. There is a reason of the absolute prevalence of C-plane GaN crystals. When a sapphire ($\alpha$-$Al_2O_3$) single crystal substrate is used as a substrate, a C(0001) surface sapphire is used to be chosen. Sapphire belongs to a trigonal symmetry group which requires four indices for representing orientations of planes and directions. GaN has hexagonal symmetry. Lengths of c-axes are different between sapphire and gallium nitride. GaN has three typical, low index planes of A-plane, M-plane and C-plane, as explained before. A-plane or M-plane GaN cannot grow on A-plane or M-plane sapphire, because A-plane or M-plane are too complex to coincide with a similar plane of sapphire without misfit. Only C-plane of GaN can join on C-plane of sapphire. Thus, a smooth, flat C-plane GaN crystal can be easily grown on a C-plane sapphire substrate. All of the known InGaN-LEDs have a pile of C-plane GaN or InGaN layers on a C-plane sapphire substrate.

Similarly, in the case of GaAs substrates, a three-fold rotationally symmetric (111) GaAs substrate is selected as a substrate. GaAs belongs to a cubic symmetry group. But a (111) plane of GaAs has three-fold rotational symmetry. The (111) GaAs substrate allows only C-plane GaN having the corresponding rotation symmetry to grow on. Foreign materials as a substrate cannot grow non-C-plane GaN at all.

A thick bulk crystal requires far more amount of dopants than a thin film crystal. The amount of dopants is in proportion to a thickness or volume of grown crystals. Silane gas ($SiH_4$) is a dangerous gas which sometimes induces a burst. An n-type GaN bulk crystal would require a larger amount of an n-dopant than an n-type thin film. The inventors prefer oxygen to silicon as the n-dopant, because water ($H_2O$) as an oxygen compound is far safer than silane gas ($SiH_4$). The inventors tried to dope GaN bulk crystals with oxygen as an n-dopant. However, mirror flat, C-plane GaN crystals cannot be doped enough with oxygen. The inventors discovered a fact that oxygen does not go into GaN easily via C-plane and C-plane repulses oxygen. The inventors found orientation dependence of oxygen doping for the first time. The inventors were aware of the fact that oxygen doping has orientation dependence. The inventors noticed that C-plane is the worst plane for oxygen doping.

The orientation dependence of oxygen doping is a novel phenomenon. It is not easy to understand the orientation dependence of oxygen doping. Nobody found the phenomenon before the inventors of the present invention. The inventors analysed atomic components on a surface of C-plane grown GaN crystals by SIMS(Secondary Ion Mass Spectroscopy). The SIMS determines atomic ratios on a surface of an object sample by emitting first ions, accelerating the first ions, shooting the first ions at the sample for inducing secondary ions emitted out of the sample, analysing the mass of the secondary ions and counting the numbers of the emitted secondary ions. The numbers of the emitted secondary ions are proportional to products of emission efficiencies of secondary ions and atomic ratios on the object surface. Since the emission efficiencies are known parameters, the atomic ratios are determined.

At an early stage of the SIMS analysis, insufficient resolution of the secondary ions and broadness of the first ion beam allowed a wide secondary beam to emanate from a wide area of the object. The broad secondary ion beams obscured abnormality of oxygen doping. Then, C-planes of GaN seemed to emit oxygen secondary ions.

At a later stage, the inventors succeeded in converging the first ion beam and enhancing resolution of the SIMS. Narrow converged first ions and enhanced resolution revealed a surprising fact.

A C-plane surface of a C-grown GaN includes microscopic pits or hillocks. The microscopic hillocks and pits have many non-C-planes which are called facets. A rough C-plane is an assembly of micro C-planes and micro facets. Oxygen secondary ions were measured by discriminating the micro C-planes and micro non-C-plane facets. The inventors found that the oxygen secondary ions were emitted from the micro non-C-plane facets and the micro C-planes do not emit the oxygen secondary ions. Namely, the micro C-planes included far smaller rate of oxygen than an average rate. When oxygen concentration was $5\times10^{18}$ cm$^{-3}$ at non-C-plane facets, oxygen concentration was less than $1\times10^{17}$ cm$^{-3}$ at C-planes. The facets have oxygen acceptance function which is more than 50 times as large as that of C-planes. C-planes are the poorest in the function of accepting oxygen. In the SIMS experiments, the secondary oxygen ions emanated not from C-planes but from the facets.

The inventors made a mirror-flat C-plane GaN crystal. The oxygen concentration was less than $1\times10^{17}$ cm$^{-3}$ everywhere on a sample.

The SIMS analysis taught us that oxygen is hardly doped into C-plane of GaN. The oxygen doping to a C-plane grown GaN crystal is caused by the facets which have high acceptance function of oxygen.

When a GaN crystal grows in an average in the c-direction, oxygen can be doped into GaN via the facets. Facets enable C-plane GaN to accept oxygen as an n-dopant. The oxygen accepting power is in proportion to the area of the facets. The wider the facets are, the stronger the oxygen acceptance power is. When C-plane is covered overall with facets, the oxygen acceptance power attains to the maximum.

Otherwise, an A-plane GaN seed and an M-plane GaN seed are best substrates for growing a non-C-plane GaN crystal and doping the non-C-plane GaN crystal with oxygen.

In conclusion, Si which is a prevalent n-dopant for thin films of GaN is not suitable for doping large GaN bulk crystals. Oxygen is a safer n-dopant. But conventional C-plane growth repulses oxygen. Oxygen doping is insufficient for the C-plane growth. An A-plane GaN seed, an M-plane seed and facet c-axis growth are effective to oxygen doping into GaN crystals.

SUMMARY OF THE INVENTION

The inventors have investigated possibility of oxygen doping to GaN by growing various orientations of GaN crystals. The inventors have found an orientation (plane) dependence of the oxygen doping to GaN. An accumulation of experiments taught the inventors that a flat C-plane is an unfavorable orientation but all the orientations of planes are not unfavorable to the oxygen doping. The inventors noticed an existence of orientations of GaN crystals except C-plane which are favorable to accept oxygen as an n-dopant. There are two types (1) and (2) of oxygen-acceptable planes.

(1) {kk-2kh} planes (k, h; integer)

{11-20} planes, in particular, accept oxygen with a high rate. {11-22} planes also show a high doping efficiency of oxygen. Oxygen doping efficiency is lower for higher numbers of indices of {kk-2kh}.

(2) {k-k0h} planes (k, h; integer)

{1-100} planes, in particular, are favorable planes for accepting oxygen with a high rate. {1-101} planes also show a high doping efficiency of oxygen. The higher the indices of {k-k0h} are, the lower the oxygen doping efficiency is.

Oxygen doping depends upon the orientation of planes. A {hkmn} plane has an inherent power for doping GaN with oxygen. The inherent power of doping oxygen of the plane {hkmn} can be denoted by OD{fhkmn}. Detailed dependence OD{hkmn} is not clear yet. C-plane takes the minimum of OD. Thus, for any planes other than C-plane, OD{hkmn}>OD{0001}.

For special planes the oxygen doping power can be estimated by the result of experiments.

A-planes {11-20} has more than 50 times as large power as C-plane; OD{11-20}>50OD{0001}.

M-planes {1-100} has more than 50 times as large power as C-plane; OD{1-100}>50OD{0001}.

Non-C-plane growth enables the growing GaN crystal to accept oxygen effectively. Oxygen invades into the GaN crystal via non-C-planes on the surface. One favorable case is to grow GaN having overall non-C-plane, for example, A-plane or M-plane. The other favorable case is to grow faceted GaN in the c-axis with various facets of non-C-planes on the surface. Oxygen is absorbed via non-C-planes on the surface of growing GaN more effectively than C-plane. The orientation dependence of oxygen doping has been recently discovered by the inventors. The details are not clear for the inventors yet. Coupling bonds appearing out of a crystal are changed by orientation of the surface. Elements to be coupled to the bonds are varied by the surface orientation. Thus, impurity doping may have dependence upon the orientation of the surface.

A (0001) Ga surface of GaN has high resistance against invasion of oxygen to nitrogen sites as an n-impurity. The inventors confirmed that the orientation dependence appears for all GaN growth upon sapphire substrates, silicon carbide substrates, gallium nitride substrates and so on.

BRIEF DESCRIPTION OF THE DRAWINGS

FIG. 2 is sectional views of GaN crystals of steps of Embodiment 1 for making an oxygen doped GaN single crystal in vapor phase on an M(1-100)-plane GaN single crystal seed.

FIG. 2(a) is a section of the M(1-100)-plane GaN seed.

FIG. 2(b) is a section of the M-plane GaN seed and a (1-100) GaN crystal homoepitaxially grown on the M(1-100)-plane GaN seed.

FIG. 2(c) is a section of the grown (1-100) GaN crystal from which the seed crystal has been removed by etching.

FIG. 2(d) is a section of a polished grown (1-100) GaN crystal with an M-plane surface.

FIG. 3 is sectional views of GaN crystals of steps of Comparison Example 1 for making a GaN single crystal in vapor phase on a C(0001)-plane GaN single crystal seed.

FIG. 3(a) is a section of the C(0001)-plane GaN seed.

FIG. 3(b) is a section of the C-plane GaN seed and a (0001) GaN crystal homoepitaxially grown on the C(0001)-plane GaN seed.

FIG. 3(c) is a section of the grown (0001) GaN crystal from which the seed crystal has been removed by etching.

FIG. 3(d) is a section of a polished grown (0001) GaN crystal with a C-plane surface.

FIG. 4 is sectional views of GaN crystals of steps of Embodiment 2 for making an oxygen doped n-type GaN single crystal in vapor phase by maintaining various non-C-plane facets on a C(0001)-plane GaN single crystal seed.

FIG. 4(a) is a section of the C(0001)-plane GaN seed.

FIG. 4(b) is a section of the C-plane GaN seed and a facet-growing (0001) GaN crystal grown on the C(0001)-plane GaN seed homoepitaxially in the c-axis <0001>.

FIG. 4(c) is a section of the facet-growing (0001) GaN crystal from which the seed crystal has been removed by etching.

FIG. 4(d) is a section of a polished grown (0001) GaN crystal with a C-plane surface.

DETAILED DESCRIPTION OF THE PREFERRED EMBODIMENTS

Figure 1:
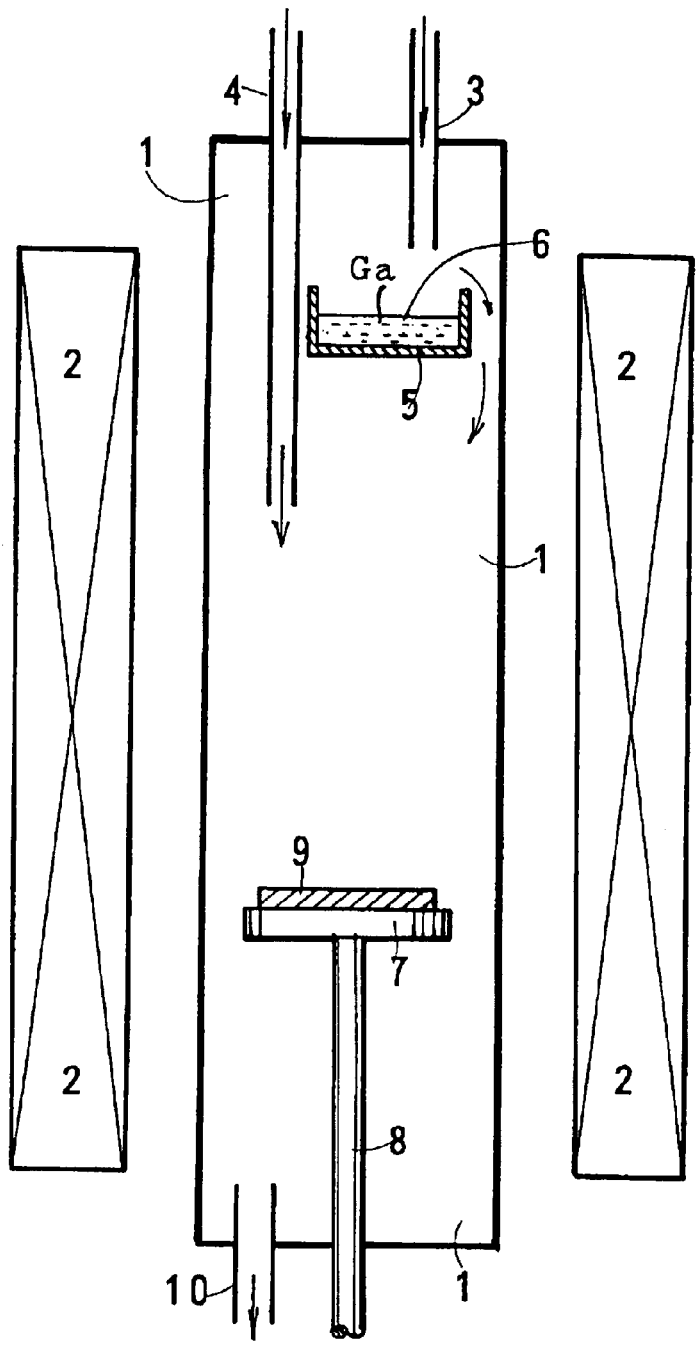
FIG. 1 is a sectional view of an HVPE (hydride vapor phase epitaxy) apparatus for growing a gallium nitride crystal.

The most effective method for doping gallium nitride crystal with oxygen is that water is added into material gases. In the case of an HVPE method, water is added into ammonia ($NH_3$) or hydrochloric (HCl) gases. When $NH_3$ and HCl inherently include water as an impurity, water needs not be added into the material gases. In this case, the GaN crystal is consequently doped with oxygen of water existing inherently in the gases. But, in order to dope with oxygen stably, it is desirable that a fixed bit amount of water is added into the gases.

There are two alternative methods of doping a gallium nitride crystal substrate with oxygen effectively in accordance with the teaching of the present invention. One (A) is a non-C-plane method which grows gallium nitride upon a seed crystal having a non-C-plane surface. The other (B) is a C-plane facet-growing method which grows gallium nitride upon a seed crystal having a C-plane surface by maintaining many variously-oriented facets on the c-axis grown crystal upon the seed crystal. The two are operative applications of the present invention.

(A) Non-C-plane Method

Method (A) employs a gallium nitride seed crystal having a {hkmn} surface except C plane {0001}, grows a {hkmn} faced gallium nitride crystal on the non-C-plane {hkmn} surface of the seed crystal and obtains a single crystal ingot extending in the same direction <hkmn> as the {hkmn} surface seed crystal.

Method (A) starts from a non-C-plane {hkmn} oriented GaN single crystal seed, wherein {hkmn}≠{0001}. Method (A) maintains the non-C-plane {hkmn} on the surface of the growing crystal for injecting oxygen via the non-C-plane to the growing non-C-plane crystal. Oxygen is effectively supplied overall into the growing non-C-plane gallium nitride crystal.

For example, a suitable candidate seed is a {1-100} plane (M-plane) gallium nitride crystal. In general, {k-k0h}-plane gallium nitride crystals are candidates for the seeds for applying Method (A).

For example, another preferable candidate seed is a {11-20} plane (A-plane) gallium nitride crystal. In general, {kk-2kh}-plane gallium nitride crystals are candidates for the seeds for applying Method (A).

In Method (A), the oxygen doping efficiency OD can be expressed as a function of the orientation indices simply by OD=OD{hkmn}

Method (A) is based upon a simple principle of selective oxygen doping on the non-C-planes. Method (A), however, has still a problem for carrying out. There is no natural gallium nitride single crystal having a non-C-plane surface. Method (A) requires synthesis of a non-C-plane gallium nitride single crystal as a seed by some means. No vapor phase heteroepitaxial growth upon a foreign material substrate can produce a non-C-plane gallium nitride crystal. At present, all of the GaN or GaInN films which are heteroepitaxially produced upon sapphire substrates of a C-plane surface with three-fold rotational symmetry for making blue LEDs, are C-plane GaN or InGaN films. No non-C-plane GaN crystal can be heteroepitaxially made upon a sapphire substrate in any cases. When heteroepitaxy makes a GaN crystal upon a sapphire substrate, it is impossible to obtain a freestanding isolated GaN crystal due to the difficulty of eliminating the sapphire substrate from the GaN/sapphire crystal. Sapphire is not suitable for a seed crystal of making a freestanding gallium nitride crystal having a non-C-plane surface.

Instead of sapphire, a gallium arsenide (111) crystal is a promising candidate for producing a gallium nitride crystal as a seed. A (111) gallium arsenide (GaAs) substrate enables vapor phase lateral overgrowth to make a gallium nitride (GaN) crystal growing along a c-axis. Unlike sturdy sapphire, the GaAs substrate can be eliminated from the GaN crystal by aqua regia. Thus, a freestanding GaN single crystal can be obtained by heteroepitaxy upon a GaAs substrate. However, the freestanding GaN crystal produced upon the (111) GaAs substrate is also a C-plane GaN single crystal having a C-plane surface. Thus, A-plane {11-20} surface GaN single crystals as seeds are obtained by growing another tall GaN single crystal in the c-direction homoepitaxially on the C-surface GaN single crystal and slicing the newly-grown GaN single crystal in {11-20} planes which are vertical to C-plane. The {11-20} surface crystals can be employed as a seed for growing a n-type GaN crystal doped with oxygen. In general, {kk-2kh} plane crystals can be made by heteroepitaxially growing a C-plane GaN single crystal on a (111) GaAs substrate, eliminating the GaAs substrate, homoepitaxially growing a thick (tall) C(0001)-plane GaN single crystal on the C-plane GaN substrate and cutting the thick C-plane GaN in the {kk-2kh} plane. Thus, Method (A) requires double steps of growing GaN single crystals for preparing a seed.

(B) C-plane Facet-Growing Method

Method (B) employs a C-plane gallium nitride seed crystal or a foreign material crystal having three-rotational symmetry, grows the C-plane {0001} gallium nitride crystal having many facets of non-C-planes {hkmn} in vapor phase by supplying material gases including oxygen components, maintains the facets during the growth, obtains a C-plane faceted single crystal ingot extending in the c-axis direction <0001>, polishes the surface of the facetted C-plane crystal, eliminates the superficial facets from the surface of the GaN single crystal, and obtains an oxygen doped n-type C-plane GaN single crystal. The average plane of the growing crystal is the C-plane. But, the surface is covered with many facets having various planes {k-k0h}, {kk-2kh} and so on. The ratio occupied by C-planes is small on the growing surface. Although C-planes reject oxygen, facets of various orientations effectively absorb oxygen.

In practice, favorable facet planes for allowing oxygen doping are {k-k0h} (k and h are integers) planes, in particular, {1-101} planes. These facets are obtained by inclining M {1-100} planes. Since M {1-100} planes are vertical to C {0001} plane, M-planes cannot be facets on C {0001} plane.

Other favorable facet planes for inducing oxygen doping are {kk-2kh} (k and h are integers) planes, in particular, {11-22} planes. These facets are obtained by inclining A {11-20} planes. Since A {11-20} planes are vertical to C {0001} plane, A-planes cannot be facets on C {0001} plane. These are the case of including only a single kind of facets.

A GaN single crystal has six-fold rotational symmetry. A single kind of facets is a set of six different individual planes. For example, a facet representation {kk-2kh} contains (kk-2kh), (kk-2k-h), (-2kkkh), (-2kkk-h), (k-2kkh) and (k-2kk-h). A single kind of facets can make hexagonal conical hills or hexagonal conical pits on a growing C-plane. Sometimes some of the six facets disappear. In the case, irregular pits or hills of trigonal, rhombic, or pentagonal cones appear on the growing C-plane. The facets absorb oxygen.

Sometimes two kinds of facets coexist on the growing C-plane. Coexistence of various kinds of facets is more favorable for absorbing oxygen from material gases. In the present invention, oxygen doping is accelerated by maintaining two kinds of facets {kk-2kh} and {k-k0h} on the growing C-plane. For example, six facets of {1-101} and six facets of {11-22} can build regular dodecagonal conical pits or hillocks which are effective to absorb oxygen. An assembly of more than two kinds of facets makes complex pits or hillocks which raise the efficiency of oxygen doping. There is little fraction of C-planes on the facet-covered, rugged GaN surface growing in the c-direction.

When two kinds of facets {kk-2kh} and {k-k0h} accompany the c-direction GaN growth, hexagonal cone pits and dodecagonal cone pits enhance the probability of absorbing oxygen. The growing GaN is converted into an n type semiconductor by being doped with oxygen. The two kind facet method has a complex feature. The total efficiency OD of oxygen doping is a sum of the contributions from the different facets {hkmn}.

$$OD = \Sigma \rho\{hkmn\} OD\{hkmn\}$$

Here, ρ{hkmn} signifies the existence probability of the facet {hkmn} on the faceted C-plane.

Oxygen doped facetted gallium nitride (GaN) single crystals are made upon gallium arsenide (GaAs) substrates by all the methods of the HVPE method, the MOC method, the MOCVD method and the sublimation method which have been employed for growing thin GaN films upon sapphire (Al$_2$O$_3$) substrates.

[Embodiment 1 (M (1-100) Surfaced GaN Crystal Seed; FIG. 2)]

An M (1-100) plane GaN single crystal is prepared as a seed for putting Method (A) into practice by slicing a bulk GaN single crystal in the planes parallel with an M (1-100) plane (FIG. 2(a)). The M-plane seed crystal has a (1-100) top surface and a (-1100) bottom surface. The bulk GaN single crystal was obtained by growing a thick GaN single crystal upon a (111) GaAs substrate by a lateral overgrowth method and removing the GaAs substrate by solving with aqua regia. The slicing direction M (1-100) is one of planes parallel with a growth direction <0001>. The sliced M-surface crystal is polished. The prepared M-plane seed crystal has a flat smooth surface which is immune from degraded superficial layers.

An HVPE (hydride vapor phase epitaxy) method grows a gallium nitride crystal on the M-plane GaN seed crystal under the following condition.

| | |
|---|---|
| growth temperature | 1020° C. |
| NH$_3$ partial pressure | 0.2 atm (2 × 10$^4$ Pa) |
| HCl partial pressure | 1 × 10$^{-2}$ atm (10$^3$ Pa) |
| growth time | 6 hours |
| GaN layer thickness | about 500 μm |

The NH$_3$ material gas includes 2 ppm of water (H$_2$O). Water is added to the NH$_3$ gas intentionally as an oxygen source. A (1-100) plane gallium nitride crystal of 500 μm in thickness is obtained, as shown in FIG. 2(b). The bottom seed GaN is removed away by polishing, as shown in FIG. 2(c). The M-plane grown crystal is evenly polished. The polished GaN crystal as shown in FIG. 2(d) has a thickness of about 400 μm.

Electric properties of the grown M-plane-GaN crystal are investigated by Hall's measurement. The Hall measurement confirms that carriers are electrons. Average values of the Hall measurement at four points on the GaN crystal are, carrier density=6×10$^{18}$ cm$^{-3}$ carrier mobility=160 Vs/cm$^2$.

The carrier density and mobility are uniform overall on the surface of the GaN crystal.

Element ratios existing at the surface of the grown GaN sample are analysed by the SIMS (secondary ion mass spectroscopy). The concentrations of elements are,

| | |
|---|---|
| hydrogen (H) | 2 × 10$^{17}$ cm$^{-3}$ |
| carbon (C) | 3 × 10$^{16}$ cm$^{-3}$ |
| oxygen (O) | 8 × 10$^{18}$ cm$^{-3}$ |
| silicon (Si) | 3 × 10$^{17}$ cm$^{-3}$. |

Since the carriers are electrons and the carrier density (free electron density) is 6×10$^{18}$ cm$^{-3}$, the grown GaN is an n-type semiconductor. N-type impurities which have a probability of giving free electrons to the GaN crystal are oxygen (O), carbon (C) and silicon (Si). Since an n-type dopant gives one electron to the matrix crystal, the concentration of the n-type dopant should be higher than the carrier density. The carbon concentration (3×10$^{16}$ cm$^{-3}$) is lower than the carrier density (6×10$^{18}$ cm$^{-3}$). The silicon concentration (3×10$^{17}$ cm$^{-3}$) is lower than the carrier density (6×10$^{18}$ cm$^{-3}$).

Only the oxygen concentration (8×10$^{18}$ cm$^{-3}$) is higher than the carrier density (6×10$^{18}$ cm$^{-3}$). This fact means that the free carriers (electrons) derive from oxygen atoms, oxygen acts as an n-type dopant and oxygen has a high activation rate (about 0.8) in the GaN crystal.

Electrical conductivity is measured. The resistivity which is an inverse of conductivity is 7×10$^{-3}$ Ωcm. The grown GaN crystal has a high conductivity of 140/Ωcm. The high conductivity enables the GaN single crystal to act as an n-type GaN substrate on which LDs or LEDs are fabricated. The known insulating sapphire substrates are suffering from the difficulty of non-cleavage and the difficulty of an n-electrode. The grown GaN substrate has good cleavage and good conduction which allows a bottom n-electrode.

The grown GaN substrate of this embodiment is a freestanding GaN substrate having a flat, smooth surface and a thickness of 400 μm. This n-type GaN substrate can be used as a substrate of devices by epitaxially piling layers thereon.

[COMPARISON EXAMPLE 1 (Flat C-Plane (0001) GaN Growth; FIG. 3)]

A C (0001) plane GaN single crystal is prepared as a seed by slicing a bulk GaN single crystal in the planes parallel with a C (0001) plane (FIG. 3(a)) for making a comparison between C-plane growth and M-plane growth. The C-plane seed crystal has a (0001) top surface and a (000-1) bottom surface. The top layer of the C-plane is a Ga layer, which is sometimes represented by (0001)Ga. The bottom layer of the C-plane is an N layer, which is sometimes represented by (0001)N. The sliced C-surface crystal is polished. The prepared C-plane seed crystal has a flat smooth surface which is immune from degraded superficial layers.

A flat, even, facetless C(0001)-plane GaN crystal is grown on the C-plane GaN seed crystal by an HVPE (hydride vapor phase epitaxy) method under the following condition.

| | |
|---|---|
| growth temperature | 1050° C. |
| NH₃ partial pressure | 0.15 atm (1.5 × 10⁴ Pa) |
| HCl partial pressure | 5 × 10⁻³ atm (5 × 10² Pa) |
| growth time | 10 hours |
| GaN layer thickness | about 500 μm |

The $NH_3$ material gas includes 2 ppm of water ($H_2O$). Water is added to the $NH_3$ gas intentionally as an oxygen source. The HVPE method maintains a flat, even surface of the growing C-plane GaN crystal. A flat C(0001) plane gallium nitride crystal of 500 μm in thickness is obtained, as shown in FIG. 3(b). The top surface is a smooth, mirror (0001) plane. The bottom seed GaN is removed away by polishing, as shown in FIG. 3(c). The C-plane grown crystal is evenly polished. The polished GaN crystal as shown in FIG. 3(d) has a thickness of about 400 μm.

The Hall measurement for determining carrier density failed in the C-GaN Comparison Example. The C-plane GaN specimen has too high resistivity and too low conductivity. The conductivity cannot be measured at any spots upon the C-GaN specimen by the measurement tools available for the inventors. The C-plane GaN is an insulator which is poor in free carriers. The C-GaN is neither n-type nor p-type but an intrinsic-type semiconductor with high resistance. The SIMS (Secondary Ion Mass Spectroscopy) measurement shows the ratios of elements on the top surface of the C-GaN,

| | |
|---|---|
| hydrogen (H) | $1 \times 10^{18}$ cm⁻³ |
| carbon (C) | $7 \times 10^{16}$ cm⁻³ |
| oxygen (O) | $1 \times 10^{17}$ cm⁻³ |
| silicon (Si) | $<2 \times 10^{16}$ cm⁻³. |

Comparison Example 1 has far smaller oxygen concentration than Embodiment 1, although $NH_3$ gas includes the same rate (2 ppm) of water. The oxygen concentration ($1 \times 10^{17}$ cm⁻³) in Comparison Example 1 is about one hundredth (1/100) of Embodiment 1 ($8 \times 10^{18}$ cm⁻³). The carbon concentration ($7 \times 10^{16}$ cm⁻³) is about twice as high as Embodiment 1 ($3 \times 10^{16}$ cm⁻³). The silicon concentration ($<2 \times 10^{16}$ cm⁻³) is reduced down to one tenth of Embodiment 1 ($3 \times 10^{17}$ cm⁻³). The difference results from the difference of the growing surfaces (the M plane for Embodiment 1 and the C plane for Comparison Example 1). The C-plane growth seems to enhance the absorption of carbon (C) and hydrogen (H). The C-plane growth seems to suppress the doping of silicon (Si) and oxygen (O). Orientation dependence of silicon is smaller than that of oxygen. Oxygen exhibits the most conspicuous orientation dependence of doping.

Comparison Example 1 which is made by the flat C-plane growth cannot absorb oxygen effectively. Poor oxygen intake incurs poor free electrons. Thus, the even C-plane growth GaN crystal becomes an insulator. The insulating GaN crystal is not suitable for a substrate for making GaN devices, because an n-electrode cannot form on the bottom of the substrate.

[Embodiment 2 (Faceted C-Plane (0001) GaN Growth; FIG. 4)]

A C (0001) plane GaN single crystal is prepared as a seed by slicing a bulk GaN single crystal in the planes parallel with a C (0001) plane (FIG. 4(a)). The C-plane seed crystal has a (0001) top surface and a (000-1) bottom surface. The top surface of the GaN seed is a (0001)Ga plane like Comparison Example 1. The sliced C-surface crystal is polished. The prepared C-plane seed crystal has a flat smooth surface which is immune from degraded superficial layers.

A faceted GaN crystal is grown in the c-direction on the C-plane GaN seed by an HVPE (hydride vapor phase epitaxy) method without eliminating facets under the following condition.

| | |
|---|---|
| growth temperature | 1030° C. |
| NH₃ partial pressure | 0.2 atm (2 × 10⁴ Pa) |
| HCl partial pressure | 1 × 10⁻² atm (10³ Pa) |
| growth time | 5 hours |
| GaN layer thickness | about 500 μm |

The $NH_3$ material gas includes 2 ppm of water ($H_2O$). Water is added to the $NH_3$ gas intentionally as an oxygen source. The HVPE method maintains faceted surface containing various pits or hillocks on the growing C-plane GaN crystal. A lower temperature of 1030° C., a higher $NH_3$ partial pressure of 0.2 atm and a higher HCl partial pressure of $1 \times 10^{-2}$ atm enable a C-plane GaN crystal to maintain facet-growth. A rugged C(0001) plane gallium nitride crystal of 500 μm in thickness is obtained, as shown in FIG. 4(b). The top surface is a rugged (0001) plane covered with many facets of various orientations except a (0001) plane. Almost all of the top is occupied by the facets. The grown GaN is glittering by the facets. Plenty of hexagonal conical pits and dodecagonal conical pits are found on the GaN crystal. The ratio of C-planes is very small on the top surface.

The facets on the top include various orientations. Prevalent facets are {1-101} planes, {11-22} planes, {1-102} planes, {11-24} planes and so on. These facets can be represented collectively by {k-k0h} planes (k, h: integer) or {kk-2kh} planes (k, h: integer).

The bottom (0001) seed GaN is removed away by polishing, as shown in FIG. 4(c). The average thickness is about 400 μm. The top of the facet-grown crystal is evenly polished for removing the facets. The polished GaN (0001) crystal as shown in FIG. 4(d) has a thickness of about 350 μm.

Electrical properties are investigated by Hall measurement at four spots of the GaN crystal of Embodiment 2. Averages at the four points are, carrier density=$5 \times 10^{18}$ cm⁻³ carrier mobility=170 Vs/cm².

The SIMS (Secondary Ion Mass Spectroscopy) measurement shows the ratios of elements on the top surface of the C-GaN,

| | |
|---|---|
| hydrogen (H) | $2 \times 10^{17}$ cm⁻³ |
| carbon (C) | $3 \times 10^{16}$ cm⁻³ |
| oxygen (O) | $5 \times 10^{18}$ cm⁻³ |
| silicon (Si) | $<4 \times 10^{16}$ cm⁻³. |

Embodiment 2 has $5 \times 10^{18}$ cm⁻³ oxygen concentration and $5 \times 10^{18}$ cm⁻³ carrier concentration. The oxygen concentration is equal to the carrier concentration. The oxygen concentration ($5 \times 10^{18}$ cm⁻³) of Embodiment 2 is 50 times as much as Comparison Example 1 ($1 \times 10^{17}$ cm⁻³). Si, C and O have a probability of acting an n-dopant in GaN. But the silicon concentration ($<4 \times 10^{16}$ cm⁻³) and the carbon concentration ($3 \times 10^{16}$ cm⁻³) are far smaller than the carrier concentration ($5 \times 10^{18}$ cm⁻³). The fact confirms that free electrons of $5\times10^{18}$ cm$^{-3}$ are generated by oxygen atoms as an n-dopant with a high activation rate nearly equal to 100%.

The difference of oxygen concentration between Comparison Example 1 and Embodiment 2 results from the difference of the facet-growth or the non-facet, mirror flat growth in the c-direction. The flat C-plane growth seems to suppress the doping of oxygen. The faceted C-plane growth allows microscopic facets to absorb oxygen atoms effectively. The many microscopic {kk-2kh} facets or {k-k0h} facets can absorb oxygen atoms like the allover M-plane of Embodiment 1. Orientation dependence of oxygen-doping is strong. C-planes are inherently the poorest plane for doping with oxygen. But, the faceted C-plane growth can dope a GaN crystal with oxygen at a high rate, because rugged C-plane includes many facets which accelerate oxygen doping.

Electrical conductivity is measured. The resistivity which is an inverse of conductivity is $6\times10^{-3}$ Ωcm. The faceted C-grown GaN crystal has a high conductivity of about 170/Ωcm. The high conductivity enables the GaN single crystal to act as an n-type GaN substrate on which LDs or LEDs are fabricated. The known insulating sapphire substrates are suffering from the difficulty of non-cleavage and the difficulty of an n-electrode. The present invention gives a Si-undoped, n-type GaN bulk single crystal substrate which is doped with oxygen and has good cleavage and good conduction which allows a bottom n-electrode.

The faceted C-grown GaN substrate of Embodiment 2 is a freestanding GaN substrate having a flat, smooth surface and a thickness of 350 μm after the facets have been removed by polishing. The obtained n-type GaN substrate is available for a substrate of devices by epitaxially piling layers thereon.

What we claim is:

1. An oxygen doping method to a gallium nitride single crystal substrate, comprising the steps of:
   preparing a non-C-plane gallium nitride single crystal seed having a surface except C-plane,
   supplying the non-C-plane gallium nitride seed with material gases including a gallium material, a nitrogen material and an oxygen material without silicon,
   growing a gallium nitride bulk crystal upon the non-C-plane gallium nitride seed in vapor phase,
   maintaining the non-C-plane surface on the growing gallium nitride bulk crystal, and
   doping the growing gallium nitride bulk crystal with oxygen via the non-C-plane surface.

2. The method according to claim 1, wherein the non-C-plane surface is {kk-2kh} planes (k,h; integer) and the {kk-2kh} planes are maintained during the growth as the surface of the growing gallium nitride bulk crystal for doping the crystal with oxygen via the {kk-2kh} planes.

3. The method according to claim 2, wherein the non-C-plane surface is {11-20} planes (A-planes) and the {11-20} planes are maintained during the growth as the surface of the growing gallium nitride bulk crystal for doping the crystal with oxygen via the {11-20} planes.

4. The method according to claim 1, wherein the non-C-plane surface is {k-k0h} planes (k,h; integer) and the {k-k0h} planes are maintained during the growth as the surface of the growing gallium nitride bulk crystal for doping the crystal with oxygen via the {k-k0h} planes.

5. The method according to claim 4, wherein the non-C-plane surface is {1-100} planes (M-planes) and the {1-100} planes are maintained during the growth as the surface of the growing gallium nitride bulk crystal for doping the crystal with oxygen via the {1-100} planes.

6. The method according to claim 1, wherein the non-C-plane surface includes {1-101} planes.

7. The method according to claim 1, wherein the non-C-plane surface includes {11-22} planes.

8. An oxygen doping method to a gallium nitride single crystal substrate, comprising the steps of:
   preparing a foreign material single crystal seed having three-fold rotational symmetry or a C-plane gallium nitride single crystal seed having a C-plane surface,
   supplying the foreign material seed or the C-plane gallium nitride seed with material gases including a gallium material, a nitrogen material and an oxygen material without silicon,
   growing a gallium nitride bulk crystal with facets having non-C-planes upon the foreign material seed or the C-plane gallium nitride seed in vapor phase,
   maintaining the facets having the non-C-planes on the growing gallium nitride bulk crystal, and
   doping the growing gallium nitride bulk crystal with oxygen via the non-C-planes of the facets.

9. The method according to claim 8, wherein the non-C-planes of the facets are {kk-2kh} planes (k,h; integer) and the {kk-2kh} planes are maintained during the growth as the facets on the growing gallium nitride bulk crystal for doping the crystal with oxygen via the {kk-2kh} planes.

10. The method according to claim 9, wherein the non-C-planes of the facets are {11-21} and {11-22} planes and the {11-21} and {11-22} planes are maintained during the growth as the facets on the growing gallium nitride bulk crystal for doping the crystal with oxygen via the {11-21} and {11-22} planes.

11. The method according to claim 9, wherein the non-C-planes of the facets are {11-22} planes and the {11-22} planes are maintained during the growth as the facets on the growing gallium nitride bulk crystal for doping the crystal with oxygen via the {11-22} planes.

12. The method according to claim 9, wherein the non-C-planes of the facets are {11-21} planes and the {11-21} planes are maintained during the growth as the facets on the growing gallium nitride bulk crystal for doping the crystal with oxygen via the {11-21} planes.

13. The method according to claim 8, wherein the non-C-planes of the facets are {k-k0h} planes (k,h; integer) and the {k-k0h} planes are maintained during the growth as the facets on the growing gallium nitride bulk crystal for doping the crystal with oxygen via the {k-k0h} planes.

14. The method according to claim 13, wherein the non-C-planes of the facets are {1-101} planes and the {1-101} planes are maintained during the growth as the facets on the growing gallium nitride bulk crystal for doping the crystal with oxygen via the {1-101} planes.

* * * * *